US007522055B2

(12) United States Patent
Carrender et al.

(10) Patent No.: US 7,522,055 B2
(45) Date of Patent: Apr. 21, 2009

(54) METHOD AND APPARATUS FOR TESTING RFID DEVICES

(75) Inventors: Curtis Lee Carrender, Morgan Hill, CA (US); Mark A. Hadley, Newark, CA (US)

(73) Assignee: Alien Technology Corporation, Morgan Hill, CA (US)

( * ) Notice: Subject to any disclaimer, the term of this patent is extended or adjusted under 35 U.S.C. 154(b) by 0 days.

(21) Appl. No.: 11/929,632

(22) Filed: Oct. 30, 2007

(65) Prior Publication Data

US 2008/0117051 A1    May 22, 2008

Related U.S. Application Data

(63) Continuation of application No. 11/127,697, filed on May 11, 2005, now Pat. No. 7,301,458.

(51) Int. Cl.
*G08B 13/14* (2006.01)
*G06K 7/00* (2006.01)

(52) U.S. Cl. .................. 340/572.1; 340/572.4; 235/438

(58) Field of Classification Search ............. 340/572.1, 340/572.4, 572.7; 235/438, 437, 492
See application file for complete search history.

(56) References Cited

U.S. PATENT DOCUMENTS

| | | | |
|---|---|---|---|
| 6,104,291 A | 8/2000 | Beauvillier et al. | |
| 6,487,681 B1 * | 11/2002 | Tuttle et al. | 714/25 |
| 6,657,289 B1 | 12/2003 | Craig et al. | |
| 6,683,663 B1 | 1/2004 | Hadley et al. | |
| 6,816,380 B2 | 11/2004 | Credelle et al. | |
| 6,850,312 B2 | 2/2005 | Jacobson et al. | |
| 6,864,435 B2 | 3/2005 | Hermanns et al. | |
| 6,951,596 B2 | 10/2005 | Green et al. | |
| 7,164,353 B2 * | 1/2007 | Puleston et al. | 340/514 |
| 7,187,293 B2 * | 3/2007 | White et al. | 340/572.8 |
| 7,214,569 B2 * | 5/2007 | Swindlehurst et al. | 438/125 |
| 7,292,148 B2 | 11/2007 | Forster | |
| 7,295,117 B2 * | 11/2007 | Forster et al. | 340/572.1 |
| 7,298,266 B2 | 11/2007 | Forster | |
| 7,298,267 B2 * | 11/2007 | Forster | 340/572.1 |
| 7,307,527 B2 | 12/2007 | Forster | |
| 7,359,823 B2 | 4/2008 | Forster | |
| 7,361,251 B2 | 4/2008 | Green et al. | |
| 7,368,032 B2 | 5/2008 | Green et al. | |

(Continued)

FOREIGN PATENT DOCUMENTS

WO    WO 2006/066938    6/2006

OTHER PUBLICATIONS

Alien Product Schematic, "Strap, RFID, Meson, Sheet", 9700020-001 Rev: A, Oct. 30, 2003, (4 pages).

(Continued)

*Primary Examiner*—Toan N Pham
(74) *Attorney, Agent, or Firm*—Blakely, Sokoloff, Taylor & Zafman LLP

(57) ABSTRACT

A method and apparatus for testing RFID straps. Arrays of RFID straps in a roll-to-roll process are coupled to an array of test elements. RF programming and interrogation signals are frequency and time multiplexed to the RFID array. Return signals are detected to determine sensitivity and programmability parameters of the RFID straps.

25 Claims, 14 Drawing Sheets

(SECTION A-A)

U.S. PATENT DOCUMENTS

2002/0167397 A1* 11/2002 Eroglu et al. ............. 340/10.6
2002/0186004 A1    12/2002 Prazeres da Costa et al.
2004/0160233 A1     8/2004 Forster
2005/0223286 A1    10/2005 Forster
2006/0226982 A1    10/2006 Forster
2007/0018831 A1*    1/2007 Shanton ................ 340/572.7

OTHER PUBLICATIONS

PCT Notification of the International Search Report and The Written Opinion of the International Searching Authority, or the Declaration, for PCT/US2006/016898, and the Written Opinion, date of mailing Sep. 19, 2006 (11 pages).

U.S. Appl. No. 60/601,991, "Singulation of RFID Tags for Testing and/or Programming", Joe White, et al., filed Aug. 17, 2004, pp. 1-12.

* cited by examiner (SECTION A-A)

WEB DIRECTION (SECTION B-B)

(SECTION C-C)

| COLUMN | 1 | 2 | 3 | 4 | 5 | 6 | | m-1 | m |
|---|---|---|---|---|---|---|---|---|---|
| FREQUENCY | f1 | f2 | f3 | f4 | f5 | f6 | | fm-1 | fm |

| | | | | | |
|---|---|---|---|---|---|
| 1 | n/2+1 | 1 | n/2+1 | 1 | n/2+1 |
| 2 | n/2+2 | 2 | n/2+2 | 2 | n/2+2 |
| 3 | n/2+3 | 3 | n/2+3 | 3 | n/2+3 |
| 4 | n/2+4 | 4 | n/2+4 | 4 | n/2+4 |

| | |
|---|---|
| 1 | n/2+1 |
| 2 | n/2+2 |
| 3 | n/2+3 |
| 4 | n/2+4 |

| | | | | | |
|---|---|---|---|---|---|
| n/2-1 | n-1 | n/2-1 | n-1 | n/2-1 | n-1 |
| n/2 | n | n/2 | n | n/2 | n |
| n/2+1 | 1 | n/2+1 | 1 | n/2+1 | 1 |
| n/2+2 | 2 | n/2+2 | 2 | n/2+2 | 2 |

| | |
|---|---|
| n/2-1 | n-1 |
| n/2 | n |
| n/2+1 | 1 |
| n/2+2 | 2 |

| | | | | | |
|---|---|---|---|---|---|
| n-3 | n/2-3 | n-3 | n/2-3 | n-3 | n/2-3 |
| n-2 | n/2-2 | n-2 | n/2-2 | n-2 | n/2-2 |
| n-1 | n/2-1 | n-1 | n/2-1 | n-1 | n/2-1 |
| n | n/2 | n | n/2 | n | n/2 |

| | |
|---|---|
| n-3 | n/2-3 |
| n-2 | n/2-2 |
| n-1 | n/2-1 |
| n | n/2 |

FIG. 12

| COLUMN NUMBER | CHANNEL | DELTA TO NEAREST NEIGHBOR | DELTA TO 2ND NEAREST NEIGHBOR |
|---|---|---|---|
| 1 | 7 | 46 | 28 |
| 2 | 53 | 18 | 42 |
| 3 | 35 | 18 | 14 |
| 4 | 11 | 24 | 21 |
| 5 | 49 | 17 | 14 |
| 6 | 32 | 17 | 14 |
| 7 | 14 | 18 | 14 |
| 8 | 46 | 18 | 14 |
| 9 | 28 | 18 | 14 |
| 10 | 60 | 18 | 14 |
| 11 | 42 | 18 | 14 |
| 12 | 18 | 24 | 21 |
| 13 | 63 | 24 | 21 |
| 14 | 39 | 18 | 21 |
| 15 | 21 | 17 | 35 |
| 16 | 4 | 17 | 21 |
| 17 | 56 | 31 | 35 |
| 18 | 25 | 25 | 21 |
| 19 | 0 | 25 | 56 |

FIG. 13

METHOD AND APPARATUS FOR TESTING RFID DEVICES

RELATED APPLICATIONS

This is a continuation application to U.S. patent application Ser. No. 11/127,697 filed on May 11, 2005 now U.S. Pat. No. 7,301,458.

GOVERNMENT RIGHTS NOTICE

This invention was made with U.S. Government support under Contract No. H94003-04-2-0406. The U.S. Government has certain rights to this invention.

TECHNICAL FIELD

Embodiments of the invention relate to the field of radio frequency identification (RFID) systems and, in particular, to testing RFID devices.

BACKGROUND

Radio frequency identification (RFID) devices are used in the form of RFID labels or RFID tags to associate objects with an identification code that may be read or programmed at a distance by stimulating the RFID device with a radio frequency (RF) interrogation or programming signal. Typically, an RFID device consists of an active or passive semiconductor chip assembled with an antenna to receive RF energy from a reader and to transmit or reflect RF energy to the reader in response to an interrogation or programming signal.

High volume manufacturing methods and systems have been developed to produce RFID devices. One system, developed by Alien Technology Corporation of Morgan Hill, Calif., and described in U.S. Pat. No. 6,683,663, utilizes a fluidic self-assembly (FSA) process to deposit RFID chips in a flexible plastic web substrate material having recessed regions to hold the RFID chips. In subsequent operations, a flexible plastic tape material is bonded to the web material to capture the RFID chips, holes are opened over small electrical contact areas on the chips and larger electrical contacts, suitable for attaching an antenna, are screen-printed on the tape material. Each RFID chip with its associated electrical contacts on the flexible substrate assembly is referred to as an interposer, or alternatively as an RFID strap.

FIG. 1A illustrates one example of an RFID strap 100 and FIG. 1B shows a cross-section through RFID strap 100. RFID chip 101 is deposited in recess 102 of web material 103. The RFID chip is laminated between web material 103 and tape 104. Holes 105 are formed through tape 104, and two electrical contacts 106-1 and 106-2 are deposited through holes 105 and on the surface of tape 104. FIG. 2 illustrates an array of RFID straps 200 on a segment of the web material. In practice, RFID straps are manufactured in large continuous arrays in a roll-to-roll process that produces many thousands of straps.

In conventional RFID manufacturing systems, the RFID straps are diced from the web array, and assembled with antennas to form a complete RFID device, before any functional RF testing is performed. At this point in the manufacturing process, an assembled RFID device may fail functional testing if the antenna connection is poor or if the RFID chip is defective. If the cause of failure is a defective RFID chip that could have been identified before the final assembly step, then the time and cost associated with the antenna assembly process is wasted.

SUMMARY OF THE DESCRIPTION

A method and apparatus for testing RFID straps is described. In one embodiment, the method includes coupling an array of RFID straps to an RFID tester, multiplexing a number of test signals to the array to test the RFID straps to prevent crosstalk among the RFID straps, and detecting return signals from the RFID straps.

In another embodiment, an array of paired test elements is arranged in a number of columns. Each column of paired test elements is coupled through a switching matrix with an RFID reader capable of transmitting and receiving RFID test signals. A compression plate is configured to compress an array of RFID straps having paired contacts against the array of paired test elements. The RFID test signals are multiplexed in frequency to the columns of paired test elements and multiplexed in time to the paired test elements in each column.

In one embodiment, the array of paired test elements is directly coupled with the paired contacts in the array of RFID straps. In another embodiment, the array of paired test elements is capacitively coupled with the paired contacts in the array of RFID straps.

BRIEF DESCRIPTION OF THE DRAWINGS

The present invention is illustrated by way of example, and not of limitation, in the figures of the accompanying drawings in which:

FIG. 12 illustrates one embodiment of time-division multiplexing;

FIG. 13 illustrates one embodiment of frequency-division multiplexing; and

DETAILED DESCRIPTION

Figure 1A:
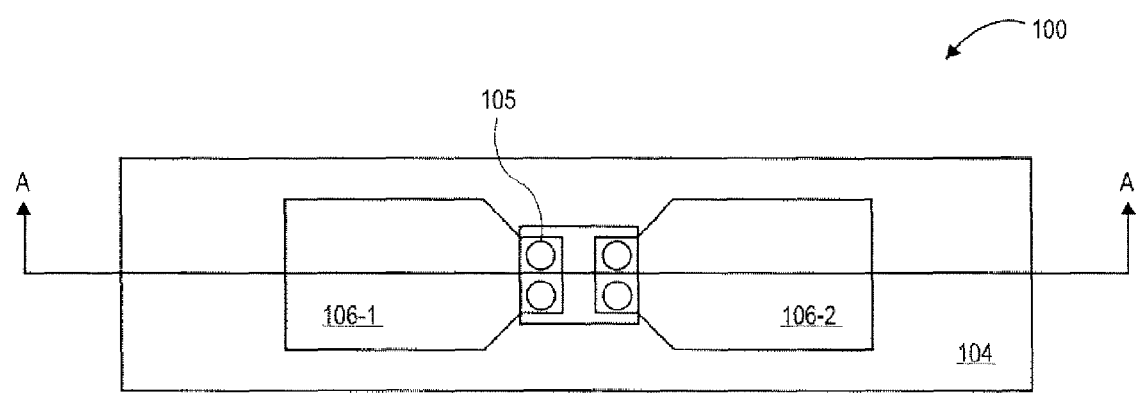
FIG. 1A illustrates a conventional RFID strap.
Figure 1B:
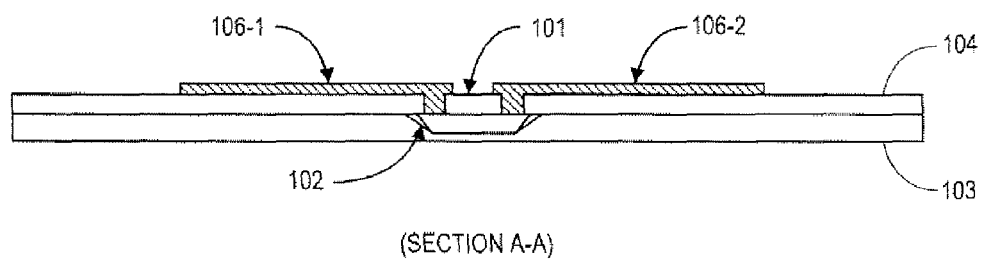
FIG. 1B illustrates a cross-section of a conventional RFID strap.
Figure 2:
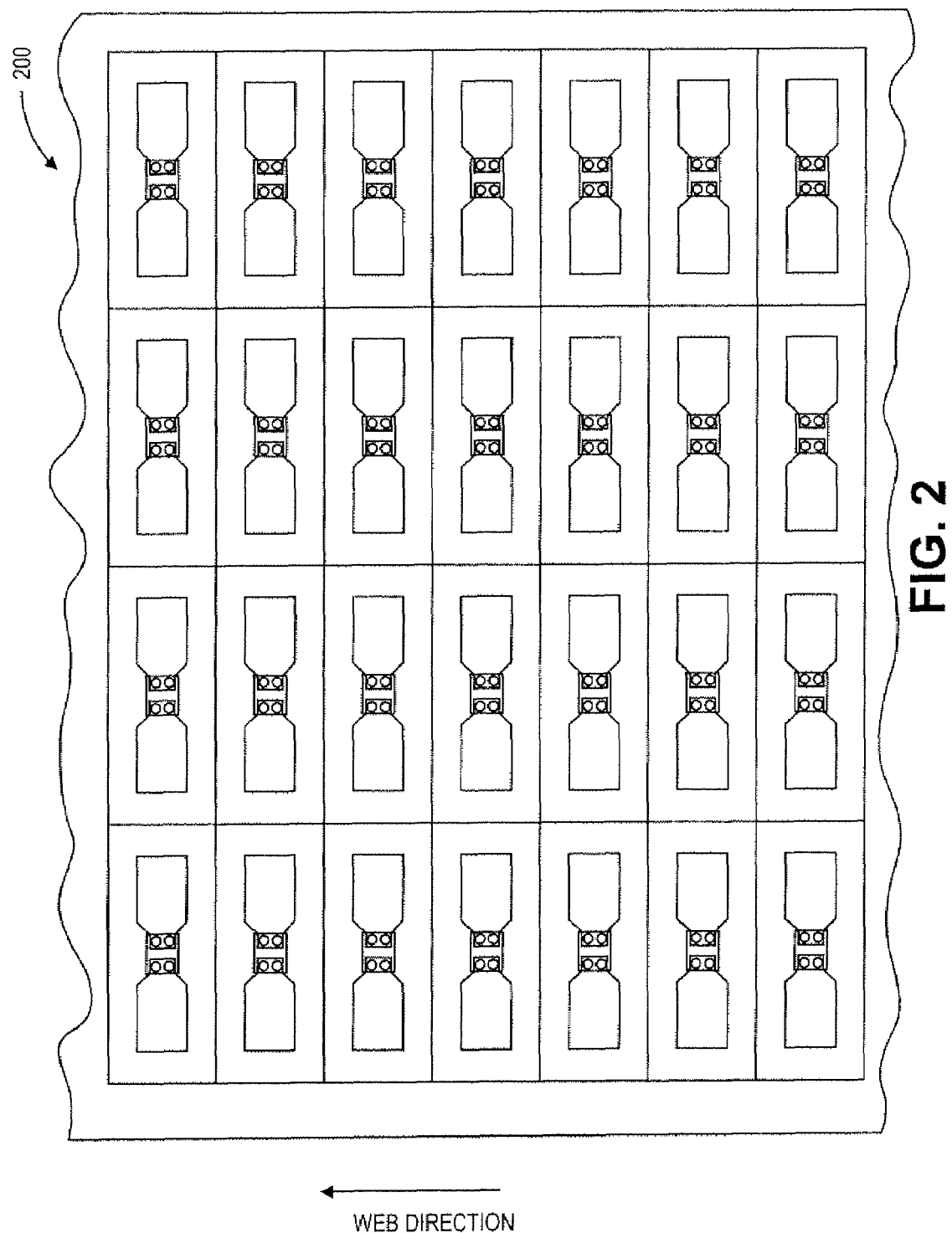
FIG. 2 illustrates a conventional array of RFID straps.
Figure 3:
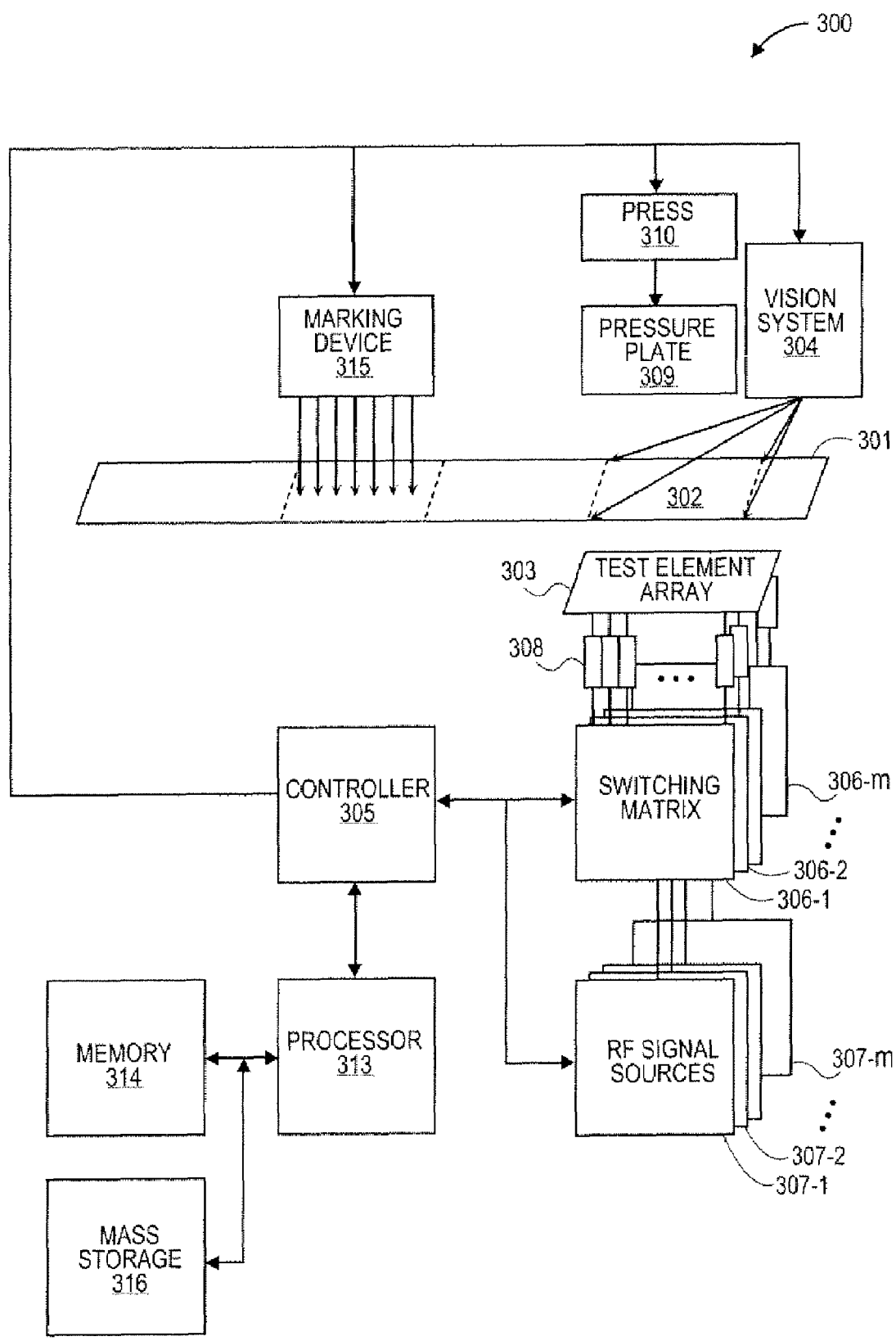
FIG. 3 illustrates one embodiment of a system for testing RFID straps.

FIG. 3 illustrates a test system 300 according to one embodiment of the invention. In FIG. 3, a continuous roll of web material 301 contains arrays of RFID straps arranged as frames 302 of m columns and n rows of RFID devices. A system of rollers, guides and motors (not shown) may be used in a conventional manner to transport the web material 301 across an in by m array of test elements 303. As described in detail below, the test element array 303 may be an array of printed elements on a printed circuit card, which may allow the array of RFID straps to be either directly coupled to the array of test elements 303, or capacitively coupled to the array of test elements 303. Alternatively, the array of test elements 303 may be an array of spring-loaded contact pins, in which case the array of RFID straps may be directly coupled to the array of test elements 303.

Each of the m columns of n test elements in test element array 303 may be connected to one of m switching matrices 306-1 through 306-m. Each of the m switching matrices maybe a 1-port×n-port switching matrix which may be capable of switching an RF test signal from one of m RF signal sources 307-1 through 307-m, to any of the n test elements in the corresponding column of the test element array 303. In one embodiment, signal sources 307-1 through 307-m may be RFID readers or transceivers configured to operate at m different frequency channels within an RFID band. In one embodiment, described in greater detail below, an impedance matching network, such as matching network 308 may be located between each element in the array of test elements 303 and a corresponding port on one of switching matrices 306-1 through 306-m.

Figure 4:
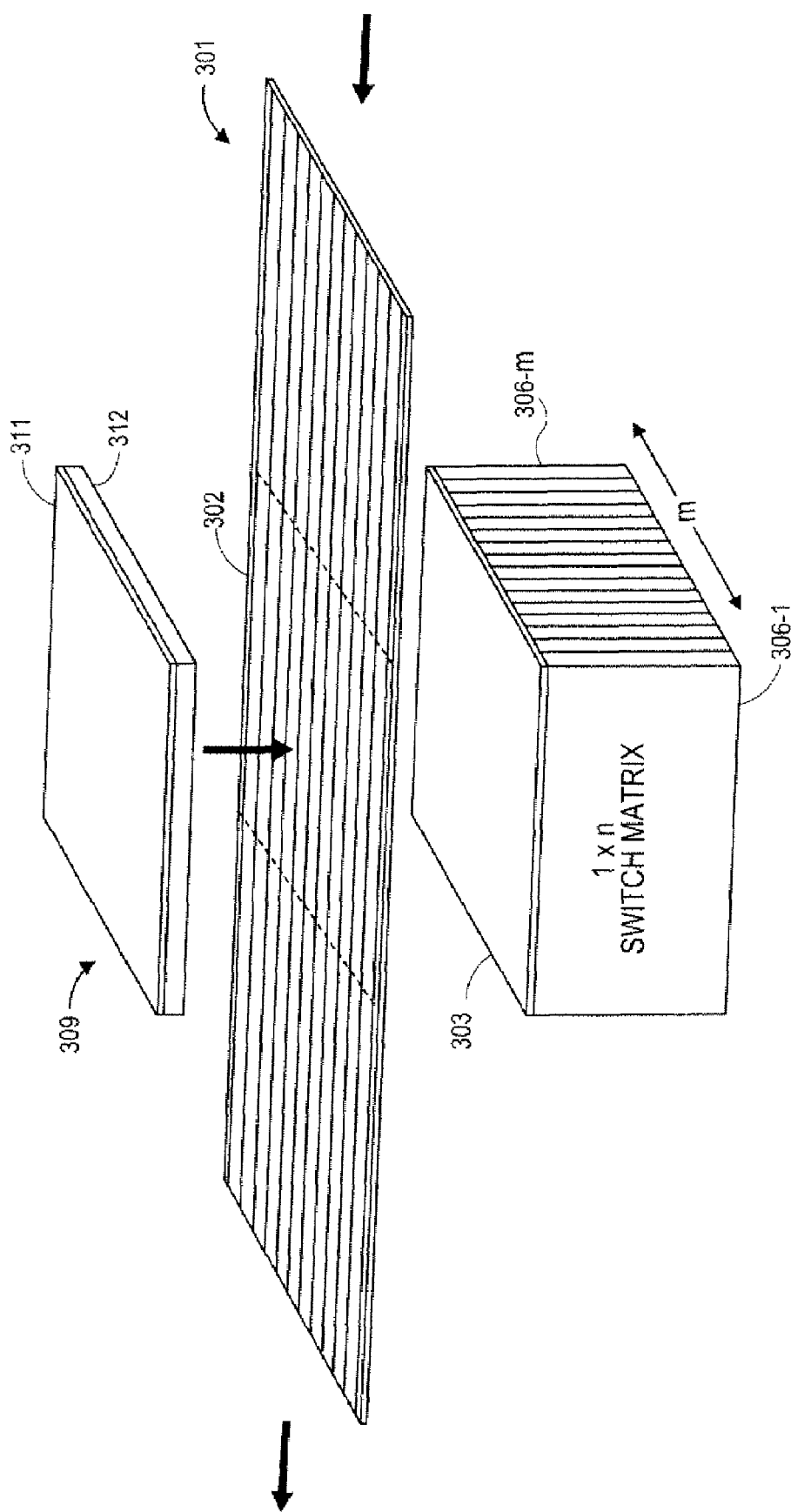
FIG. 4 illustrates another embodiment of a system for testing RFID straps.

A machine-vision system, 304 controlled by a controller 305, may be used to align the frames of RFID devices with the array of test elements 303 by matching alignment marks on the edges of the web material 301 with one or more fiducial markers on the test element array 303 in a conventional manner. After a frame 302 of RFID straps is aligned with the array of test elements 303, the frame of RFID straps 302 may be coupled to the array of test elements 303 by compressing the web material against the array of test elements 303 with a pressure plate 309. The pressure plate 309 may be operated by a press device 310 under the control of controller 305. As illustrated in FIG. 4, pressure plate 309 may have a rigid top plate 311 and a compressible bottom surface 312 to apply uniform pressure to the frame of RFID straps 302 without damaging the RFID straps. Bottom surface 312 may be any compressible material or structure such as, for example, a foam pad or an inflated bladder.

Figure 5:
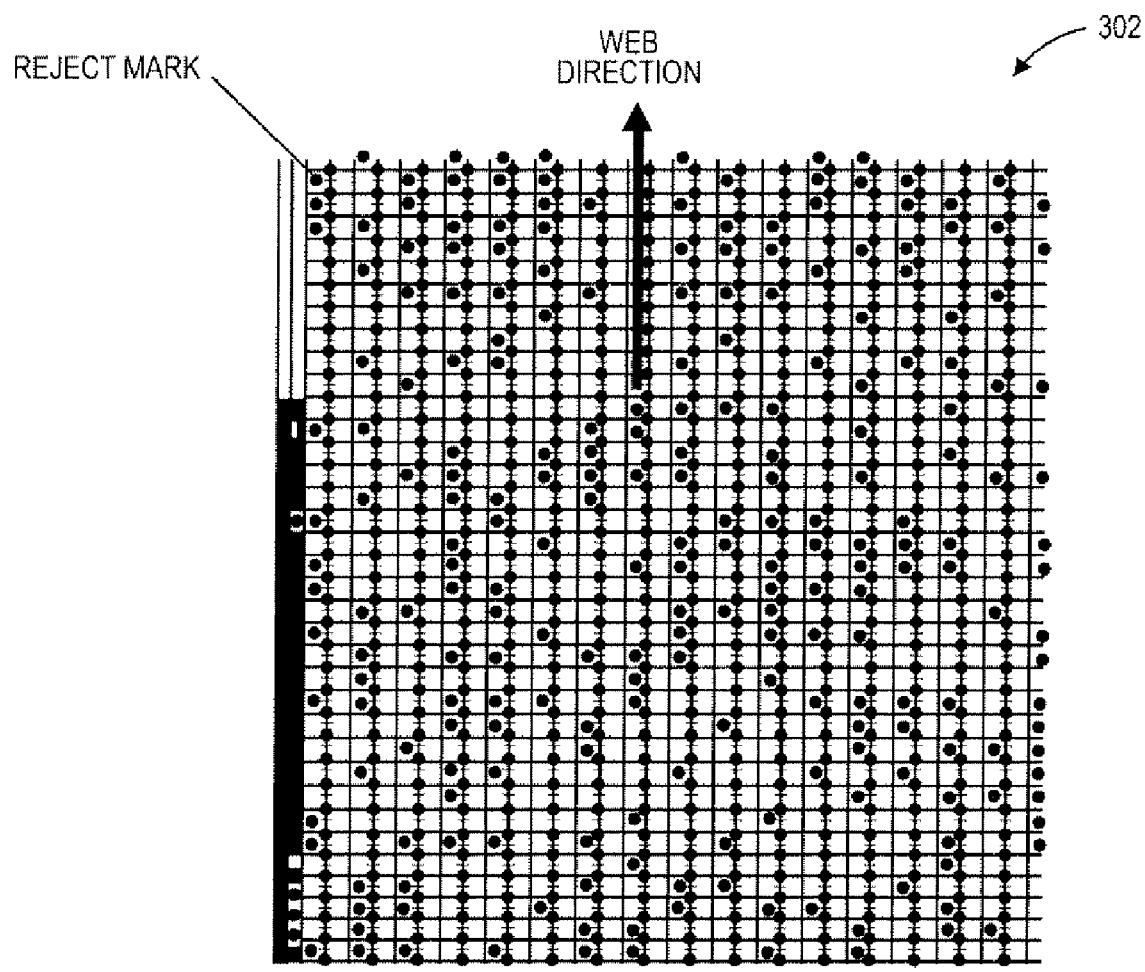
FIG. 5 illustrates marking RFID straps in one embodiment of testing RFID straps.

When the frame of RFID straps 302 has been coupled with the test element array 303, RF signals generated by RF signal sources 307-1 through 307-m may be used to program and/or test all of the RFID straps in the frame 302 for sensitivity as described in greater detail below. The test program may be an automated test process managed by a test program executing on a processor 313, which may be any general-purpose or special purpose data processing device. Test results for each RFID strap, and its location in the frame, may be stored in a memory system or device 314 coupled to processor 313, which may be any type of non-volatile memory system or device. System 300 may also include a mass storage device, such as mass storage 316 to retain data, programs, instructions and the like. Pass-fail test results and frame locations for each RFID strap in frame 302 may be transmitted to a marking device 315 that may be used to mark RFID straps that fail sensitivity or programming tests. FIG. 5 illustrates marking failed RFID straps in frame 302 with reject marks. Marking device 315 may be, for example, and inking marker or a laser marker as is known in the art.

Figure 6A:
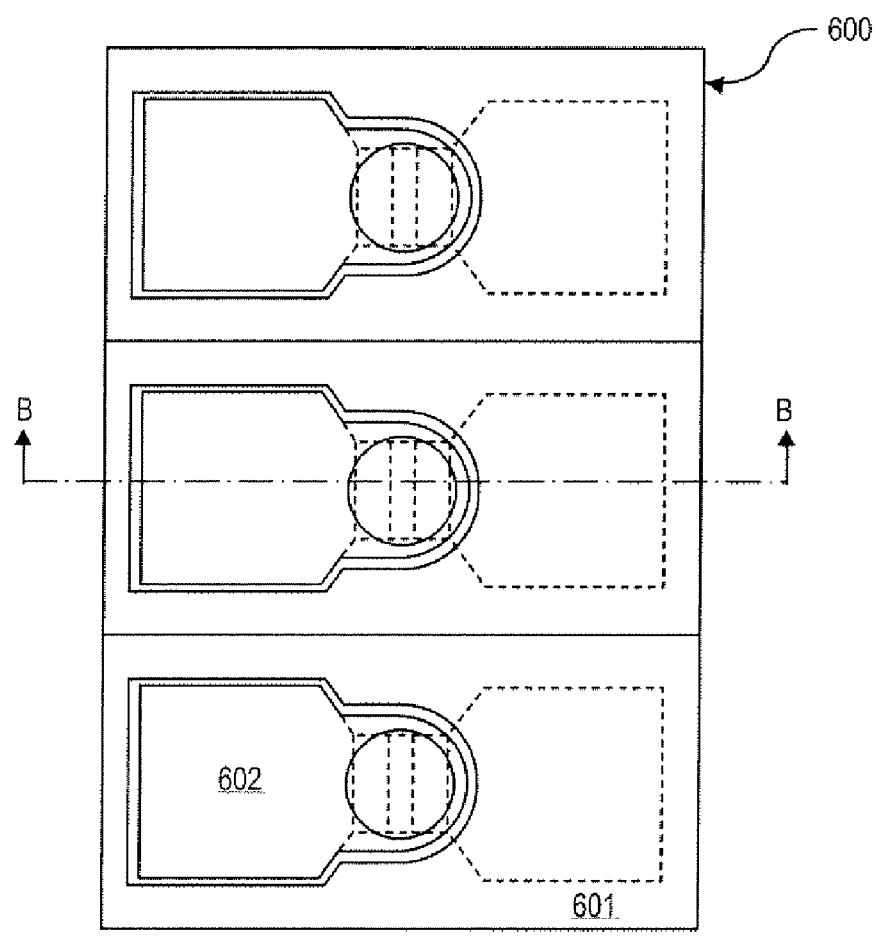
FIG. 6A illustrates one embodiment of a test element.
Figure 6B:
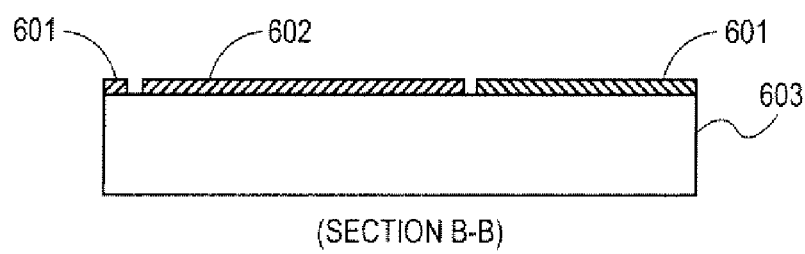
FIG. 6B illustrates a sectional view of FIG. 6A.
Figure 6C:
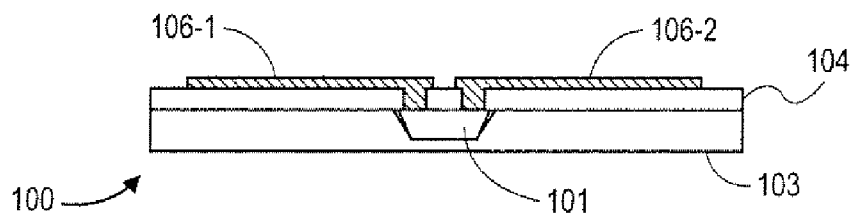
FIG. 6C illustrates a conventional RFID strap which may be tested with the embodiment of FIG. 6A.

As noted above, test element array 303 may be a printed array of test elements on a printed circuit card. FIG. 6A illustrates a section of three test element cells 600 from a test element array 303 in one embodiment of the invention. A cross section through one of the test element cells is illustrated in FIG. 6B. A cross section of the RFID strap 100 is shown in FIG. 6C and a partial outline of the RFID strap 100 is shown in FIG. 6A (dotted lines) to illustrate the relationship of the test element cell 600 to the RFID strap 100.

As illustrated in FIGS. 6A and 6B, each cell may include a pair of test elements, a ground plane metallization 601 and a signal metallization 602, on a printed circuit card 603. In one embodiment, the ground plane metallization 601 may be connected to the outer conductor of a coaxial transmission line or connector that connects the test element array 303 with a port on one of the switching matrices 306-1 through 306-m. The signal metallization may be connected to the inner conductor of the coaxial transmission line or connector. Coaxial-to-planar interconnect methods are known in the art and will not be described in detail, herein.

Figure 7A:
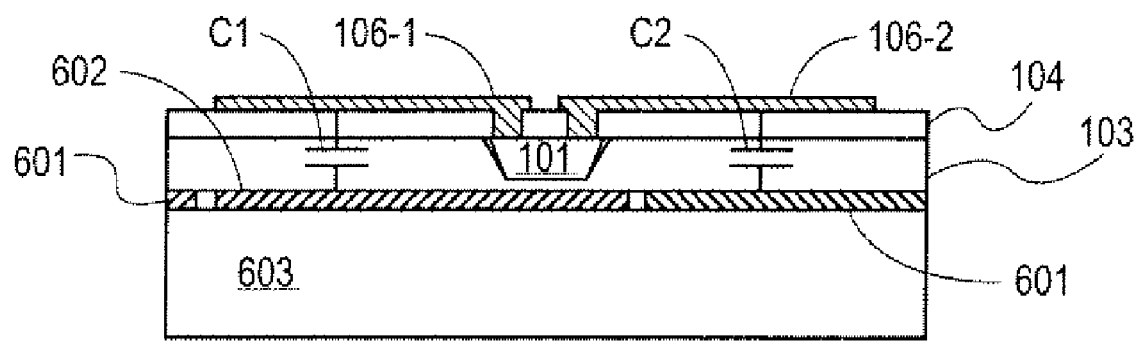
FIG. 7A illustrates a sectional view in one embodiment of coupling between the test element of FIG. 6B and a conventional RFID strap.
Figure 7B:
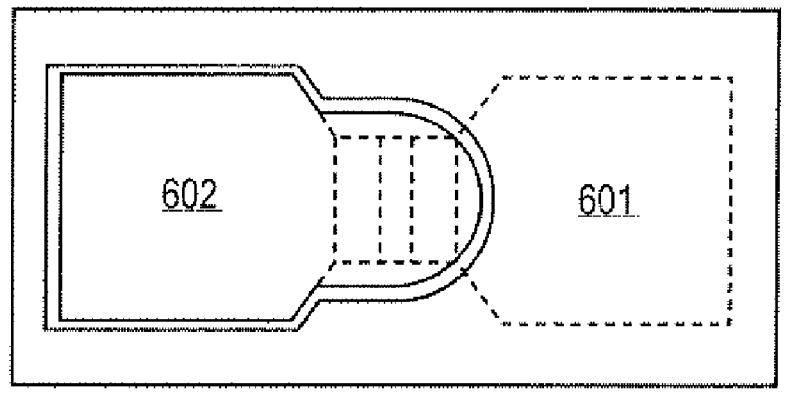
FIG. 7B illustrates a plane view of FIG. 7A.

In one embodiment, illustrated in FIGS. 7A and 7B, the RFID strap 100 may be capacitively coupled to the test element cell 600 as indicated by the equivalent coupling capacitors C1 and C2 with the web layers 103 and 104 providing an insulating dielectric layer. Ground metallization 601 couples to electrical contact 106-2 and signal metallization 602 couples to electrical contact 106-1. This embodiment provides non-symmetrical coupling to RFID strap 100. Capacitance C1 is greater than capacitance C2 because signal metallization 602 overlaps the RFID chip 101 and partially couples to electrical contact 106-2. The coupling imbalance may be small if the RFID chip is electrically and functionally symmetrical. In some fluidic self-assembly processes, however, the geometry of the RFID chip 101 may allow it to be captured in the flexible substrate material 103 in two different orientations which may be physically indistinguishable but which are functionally asymmetric. For example, the RFID chip 101 may have a ground contact and signal contact which may randomly be aligned and connected with electrical contact 106-1 and 106-2. In that case, approximately half of the RFID chips in a frame will have their signal contacts coupled to the ground metallization of the test cell, and the other half will have their signal contacts coupled to the signal metallization of the test cell. If the chip orientation is random, it will not be possible to separate RFID chip performance and chip orientation.

Figure 8A:
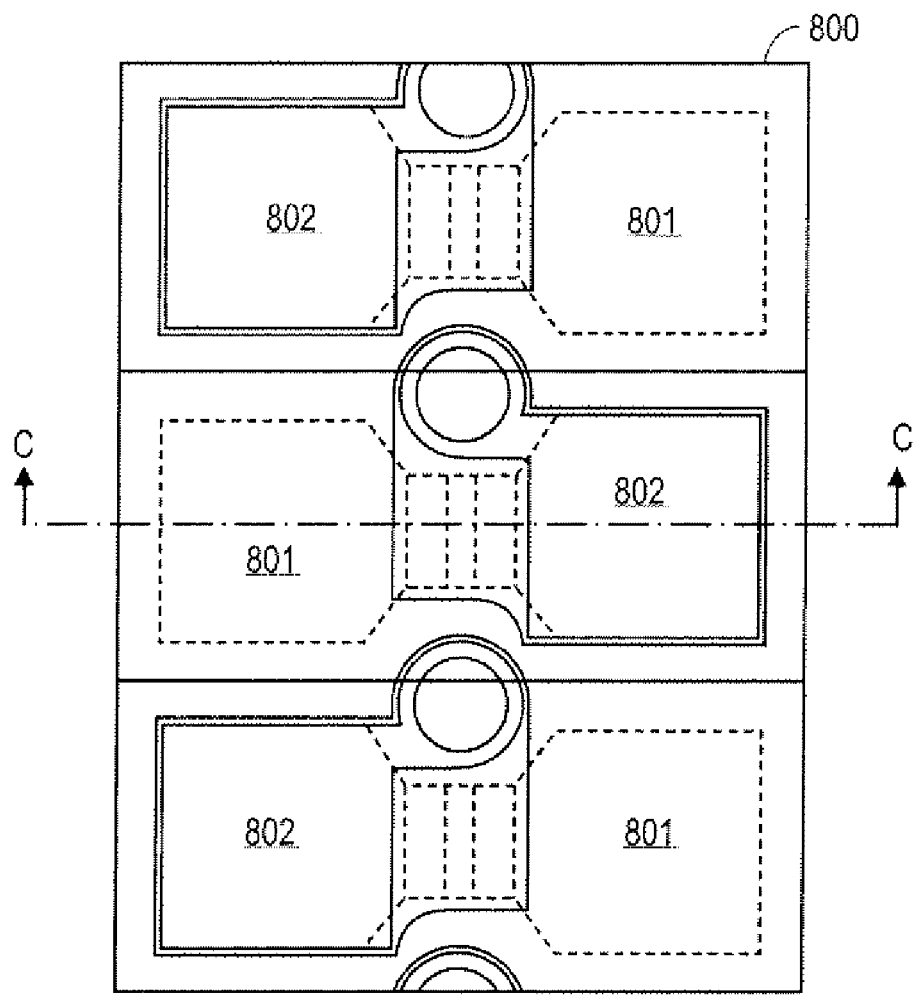
FIG. 8A illustrates a plane view of another embodiment of a test element.
Figure 8B:
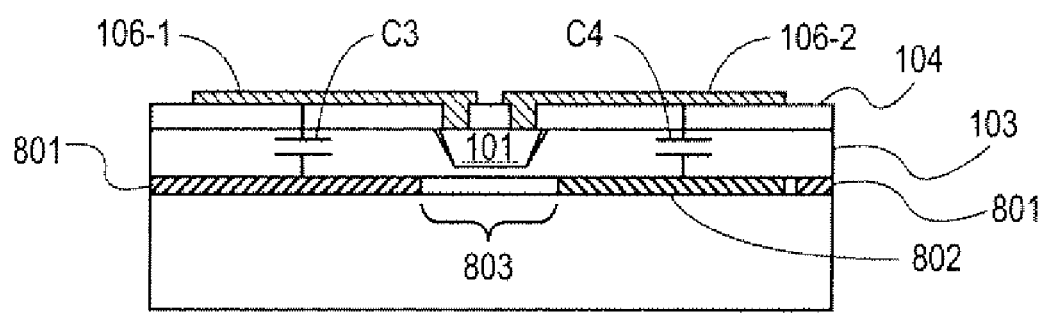
FIG. 8B illustrates a sectional view of the test element of FIG. 8A coupled with a conventional RFID strap in one embodiment.

FIGS. 8A and 8B illustrate an alternative embodiment of a test cell geometry that provides symmetrical coupling that is independent of RFID chip orientation. FIG. 8A illustrates a section of three test cells 800, superimposed over outlines of RFID strap 100, where each cell includes a pair of test elements; a ground plane metallization 801 and a signal metallization 802. FIG. 8B illustrates the capacitive coupling between the RFID and the test cell when the unmetallized surface of the web material 103 is compressed against the test elements 801 and 802. Equivalent capacitances C3 and C4 substantially equal because the area of the parallel plate capacitor C3, formed by electrical contact 106-1 and metallization 802, is substantially the same as the area of the parallel plate capacitor C4, formed by electrical contact 106-2 and metallization 801. Furthermore, because there is no metallization in window 803, under RFID chip 101, the coupling between RFID strap 100 and the test cell will be substantially independent of RFID chip orientation.

Figure 9:
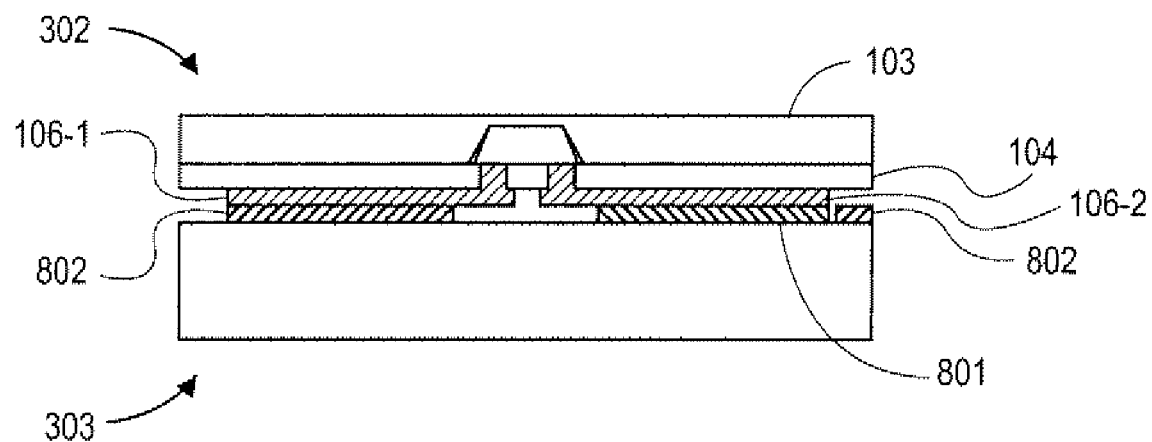
FIG. 9 illustrates a sectional view of the test element of FIG. 8A coupled with a conventional RFID strap in another embodiment.
Figure 10A:
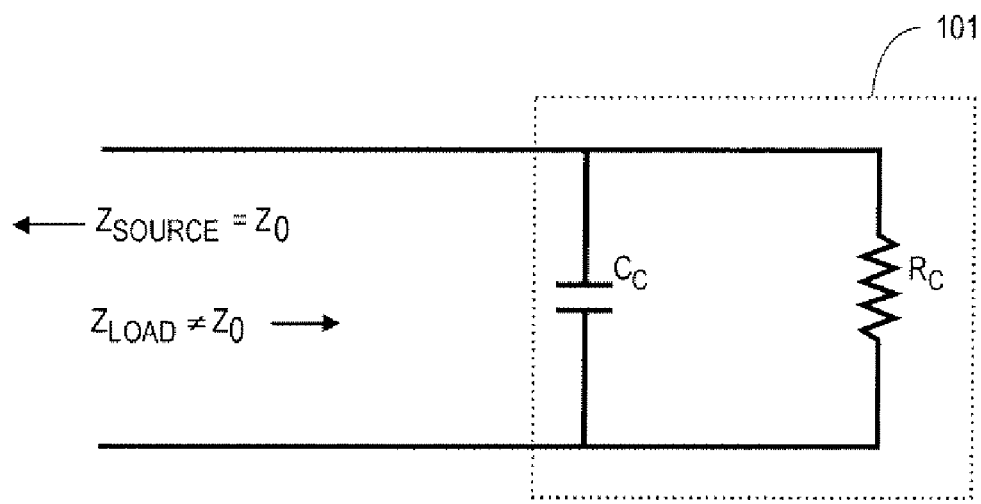
FIG. 10A illustrates an equivalent circuit of an RFID strap in one embodiment of testing RFID straps.

In one embodiment, as illustrated in FIG. 9, the orientation of web material 301 may be selected such that the metallized side 104 of the array of RFID straps 302 is compressed against test element array 303 and there is a direct electrical coupling between the test element array 303 and the array of RFID straps 302 as illustrated in FIG. 9 by the direct contact of paired electrical contacts 106-1 and 106-2 with paired test elements 802 and 801, respectively. FIG. 10A illustrates an equivalent circuit of the direct contact configuration of FIG. 9. In FIG. 10A, a parallel equivalent circuit of RFID chip 101 is represented by capacitor Cp and resistor Rp. In one embodiment, capacitor Cp may have a value of approximately 0.85 picofarad and resistor Rp may have a value of approximately 2600 Ohms. Each of RF signal sources 307-1 through 307-$m$ may have a source impedance $Z_0$ of 50 Ohms. It will be appreciated that there may be a significant mismatch between the impedance of the RFID chip and the source impedance of the RF signal source such that a substantial portion of the power available from the RF signal source may not be coupled to the RFID chip.

Figure 10B:
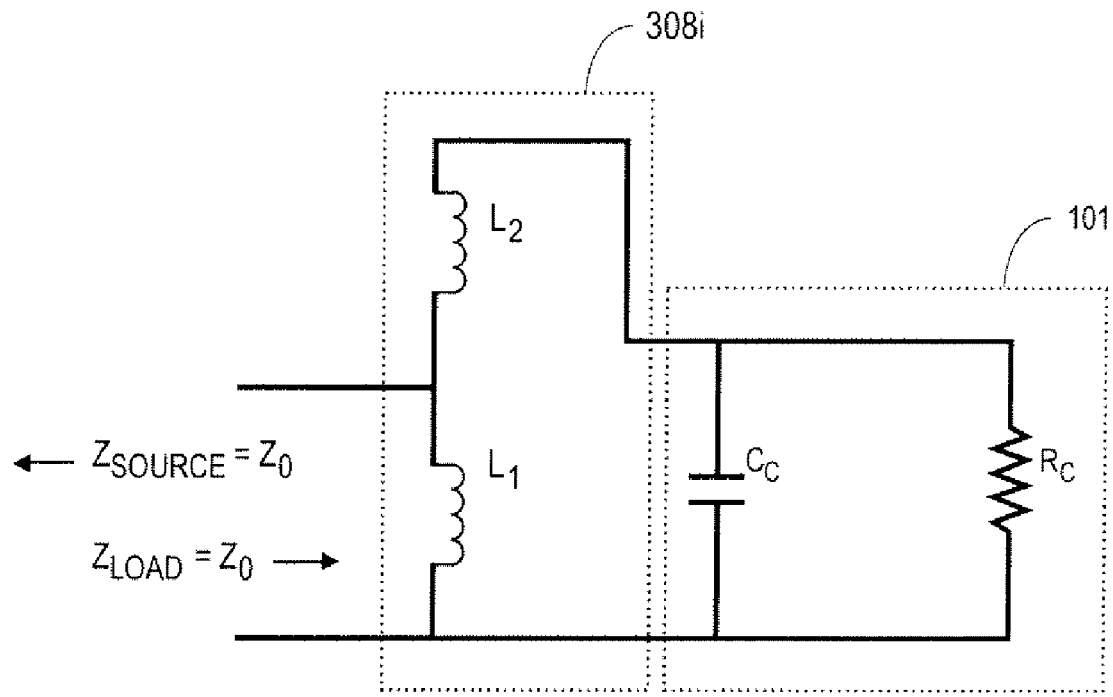
FIG. 10B illustrates one embodiment of impedance matching to an RFID strap.

As noted above, a matching network 308 may be inserted between each element in the array of test elements 303 and a corresponding port on one of switching matrices 306-1 through 306-$m$. FIG. 10B illustrates a one embodiment of a matching network 308 consisting of inductors L1 and L2 configured as an autotransformer. The values of inductors L1 and L2 may be chosen such that (L1+L2) resonates with Cp at the operating frequency $f_0$ of the RFID chip, and $[(L1+L2)/L1]^2$=Rp/Z0. That is, L1 and L2 may be chosen to satisfy the two equations:

$$(L_1+L_2)=[(2\pi f_0)^2 C_p]^{-1} \quad (1)$$

and $$[(L_1+L_2)/L_1]^2 = R_p/Z_0 \quad (2)$$

In one embodiment, for example, the operating frequency of the RFID chip may be 915 MHz, in which case solving equations (1) and (2) yields values for L1 and L2 of approximately 6 nanohenries and 31 nanohenries, respectively.

Figure 11A:
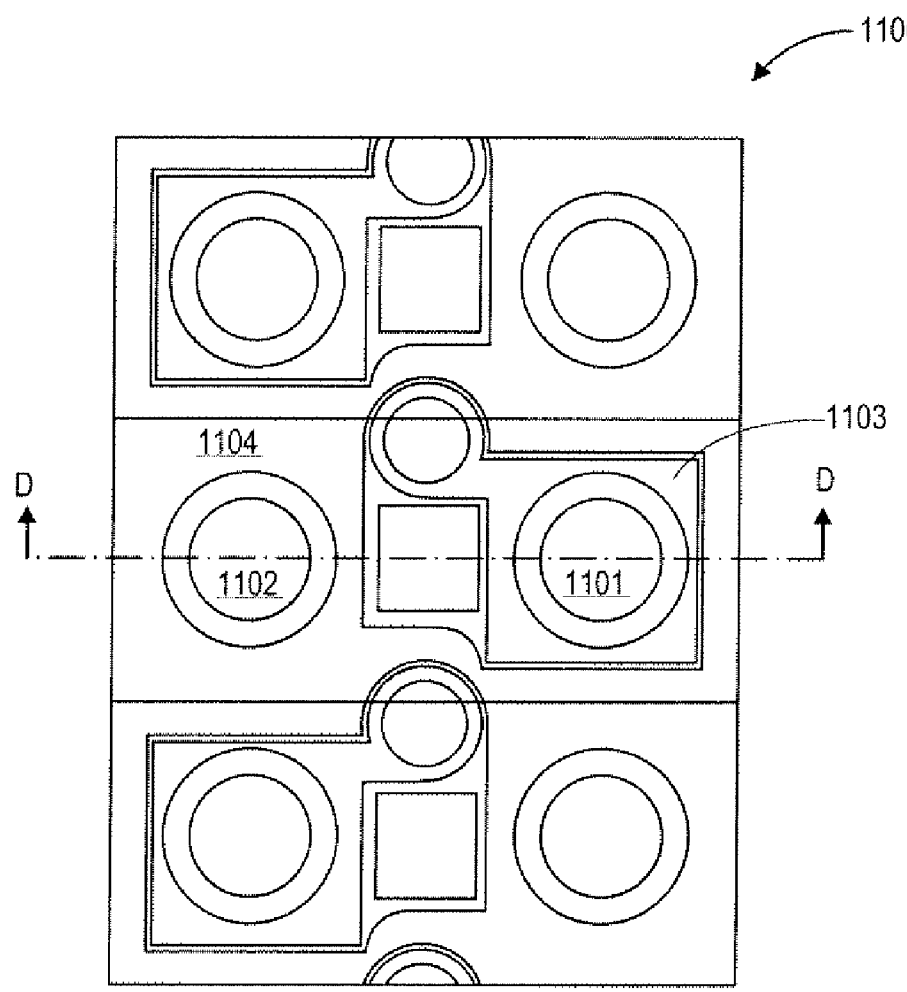
FIG. 11A illustrates a plane view of another embodiment of a test element.
Figure 11B:
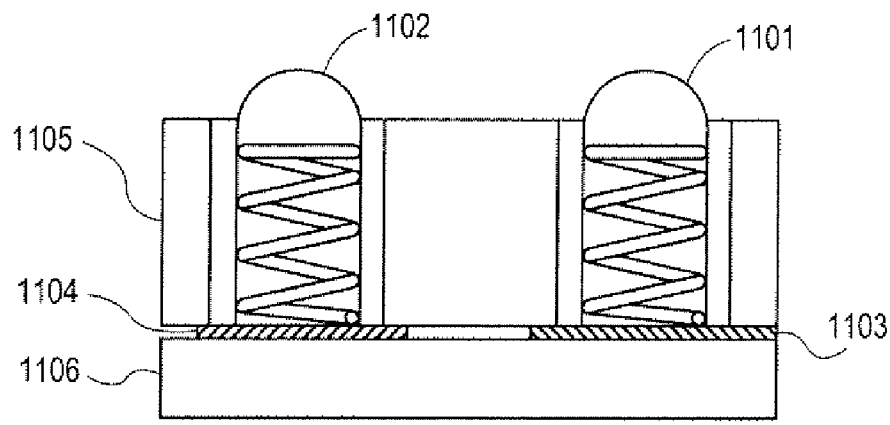
FIG. 11B illustrates a sectional view of FIG. 11A.

As noted above, spring-loaded test contacts may be used in lieu of printed test contacts in test element array 303. FIGS. 11A and 11B illustrate one embodiment of an array of test elements 1100 in a multi-layer printed circuit board (PCB) incorporating a spring-loaded signal contact 1101 and a spring-loaded ground contact 1102 in one layer 1105 of the multi-layer PCB. On another layer 1106 of the multi-layer PCB, internal printed contact 1103 provides a path for signal currents and internal printed contact 1104 provides a path for ground currents.

In one embodiment, when the m×n array of RFID straps 302 has been coupled to the m×n array of test elements 303, signal sources 307-1 through 307-$m$ may be time-division multiplexed to the m×n array of RFID straps by 1×n switching matrices 306-1 through 306-$m$. Each switching matrix may be dedicated to one of the m columns of n RFID straps. FIG. 12 illustrates an m×n array corresponding to an array of test elements 303 (where m and n are assumed to be even numbers for convenience). As illustrated in FIG. 12, column 1 may be tested at frequency f1, column 2 may be tested at frequency f2, and so on through column m tested at frequency fm. A time division multiplexing table may control the order of testing RFID straps in each column. In one embodiment, illustrated in FIG. 12, odd numbered columns may have one test order and even numbered columns may have another test order. Testing of odd numbered columns may start at the top of the column and proceed sequentially to the bottom of the column. Testing of even numbered columns may begin at the middle of the columns, proceed sequentially to the bottom of the column and continue from the top of the column to the middle. Thus, the RFID straps under test in any two adjacent columns will always be at least n/2 positions apart to maximize isolation and minimize crosstalk.

Frequencies f1 through fm may be chosen to maximize the frequency separation of nearest columns and next nearest columns in a specified operating frequency band. For example, the standard North American RFID band spans 62 channels of 400 MHz from 902 MHz to 928 MHz. FIG. 13 is a table illustrating the selection of channels to achieve maximum separation from first and second nearest neighbors for the case of m=19. The solution may not be unique for a given number of columns and number of channels, but that there will always be an optimum solution based on a minimum channel separation of first and second nearest neighbors. For example, in the solution set illustrated in FIG. 13, the channel separation between any two closest neighbors is never less than 18 channels and the channel separation between any two second closest neighbors is never less than 13 channels. Maximizing isolation between RFID straps under test is important because the test power incident on each RFID device may be 60 to 80 dB higher than the return signal from the device. So if one device happens to be responding to a reader when another reader is transmitting to a nearby device, cross talk can be a problem if the isolation is less than the difference between the incident and return signals.

Using a multiplexed testing method, such as the method described above, m RFID straps may be tested simultaneously over n test periods to completely test an m×n array of RFID straps. RFID straps may be tested for both RF sensitivity and programmability during a test period. In one embodiment, the RF signal of each RF signal source may be cycled through two or more power levels where an RFID strap is expected to be programmable. The programming data may be, for example, an identification code for the RFID strap, a lot and/or date code, a manufacturing code that identifies the position of the RFID strap on the sheet or roll, the test results for the RFID strap or any combination thereof. If the RFID strap is successfully programmed, the RFID strap may respond, for example, by transmitting a confirmation code or by retransmitting the programmed information.

If the programmability of the RFID strap is confirmed, the power level of the RF signal source (e.g., one of RF signal sources 307-1 through 307-$i$) may be reduced to two or more lower power levels that correspond to a specified sensitivity for RFID interrogation signals. If the RFID strap responds to the interrogation signals, the test system processor 313 may record the test results in a database in memory 314. The test results may include the programmability and interrogation signal levels, location codes and/or simple pass/fail flags. If the RFID strap does not respond to both the programming signals and the interrogation signals, the RFID strap's location may be recorded in the database with a failed flag. In one embodiment, marking device 315 may use the database in memory 314 to mark defective RFID straps when their associated array 302 is transported to the marking device as part of the aforementioned roll-to-roll test process.

Figure 14:
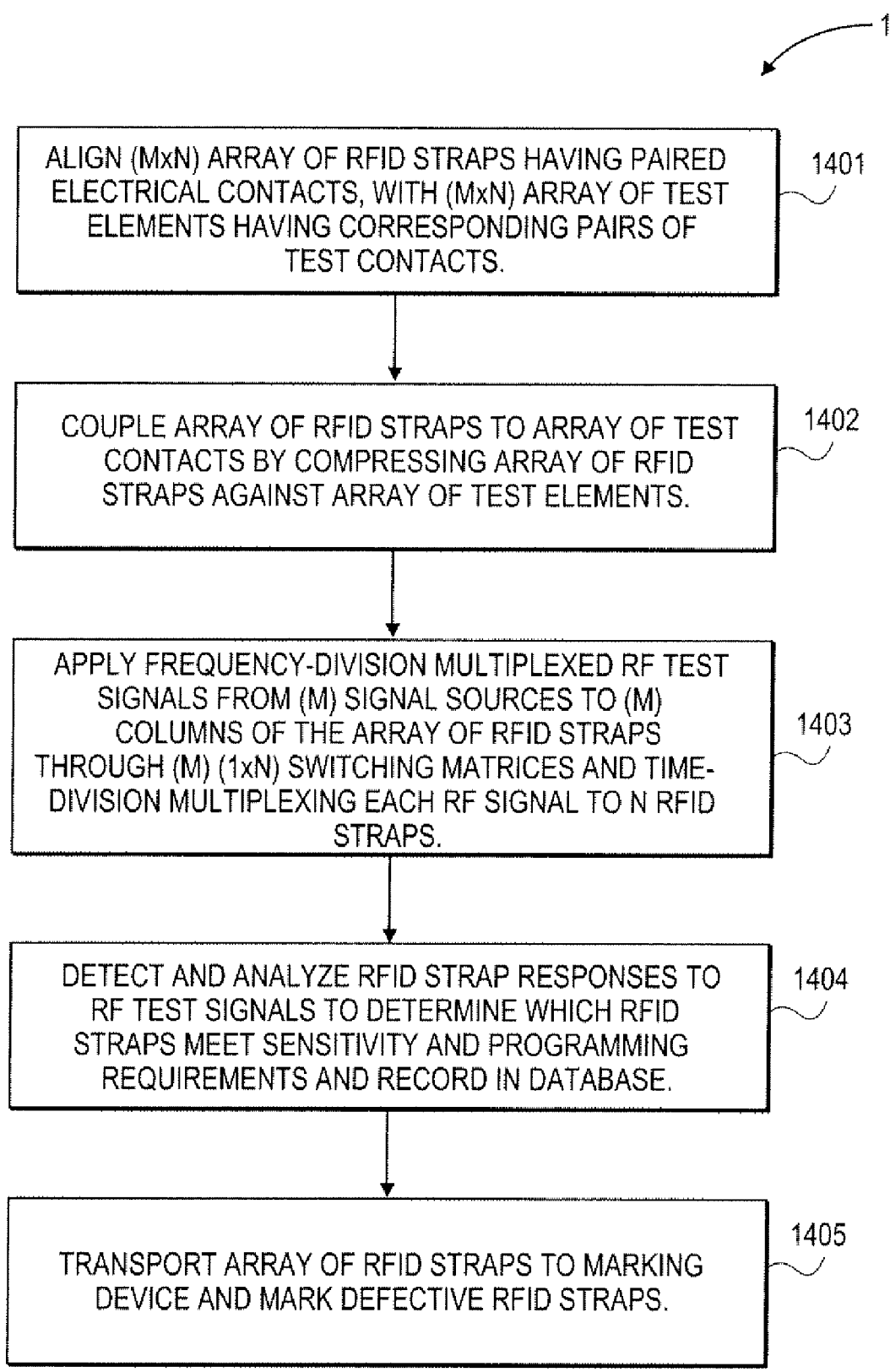
FIG. 14 illustrates a method in one embodiment of testing RFID straps.

With reference to FIG. 3, FIG. 14 illustrates one embodiment of a method 1400 for testing RFID straps. In the exemplary embodiment, an (m×n) array of RFID straps 302 having paired contacts is aligned with an (m×n) array of test elements 303 having corresponding paired test contacts (step 1401). The array of RFID straps is coupled to the array of test elements by compressing the array of RFID straps against the array of test elements (step 1402). RF signals from (m) frequency-division multiplexed signal sources 307-1 through 307-m are applied to the m columns of the array of RFID straps through (1×n) switching matrices 306-1 through 306-m, and each signal source is time-division multiplexed to the n RFID straps in its corresponding column (step 1403). RFID strap responses to the test signals are detected by the RF signal sources and analyzed to determine which RFID straps meet both programming and sensitivity specifications, and the results recorded in a database in memory 314 (step 1404). Finally, the array of RFID straps is transported to a marking device 315, where RFID straps not meeting the programming and sensitivity specifications are marked as defective (step 1405).

It will be apparent from the foregoing description that aspects of the present invention may be embodied, at least in part, in software. That is, the techniques may be carried out in a computer system or other data processing system in response to its processor such as processor 313, executing sequences of instructions contained in a memory, such as memory 314. In various embodiments, hardwired circuitry may be used in combination with software instructions to implement the present invention. Thus, the techniques are not limited to any specific combination of hardware circuitry and software, nor to any particular source for the instructions executed by the data processing system.

A machine-readable medium can be used to store software and data which when executed by a data processing system causes the system to perform various methods of the present invention. This executable software and data may be stored in various places including, for example, memory 314 or mass storage device 316.

Thus, a machine-readable medium includes any mechanism that provides (i.e., stores and/or transmits) information in a form accessible by a machine (e.g., a computer, network device, personal digital assistant, manufacturing tool, any device with a set of one or more processors, etc.). For example, a machine-readable medium includes recordable/non-recordable media (e.g., read only memory (ROM); random access memory (RAM); magnetic disk storage media; optical storage media; flash memory devices; etc.), as well as electrical, optical, acoustical or other forms of propagated signals (e.g., carrier waves, infrared signals, digital signals, etc.); etc.

In the foregoing description, numerous specific details are set forth such as examples of specific components, devices, methods, etc., in order to provide a thorough understanding of embodiments of the present invention. It will be apparent, however, to one skilled in the art that these specific details need not be employed to practice embodiments of the present invention. In other instances, well-known materials or methods have not been described in detail in order to avoid unnecessarily obscuring embodiments of the present invention. It should be noted that the term "coupled" as used herein, may mean directly coupled or indirectly coupled through one or more intervening components. The invention has been described, herein, with reference to specific exemplary embodiments thereof. For example switching matrices and RF signal sources have been described as being configured in columns, but they may be configured in rows in alternative embodiments. It will be evident that various modifications may be made thereto without departing from the broader spirit and scope of the invention as set forth in the claims. The specification and drawings are, accordingly, to be regarded in an illustrative sense rather than a restrictive sense.

What is claimed is:

1. A method for testing a column of radio frequency identification (RFID) straps,
   wherein an RFID strap in the column of RFID straps comprises:
   an RFID chip on a continuous web material; and
   a pair of electrical contacts on the continuous web material coupled to the RFID chip,
   the method comprising:
   transmitting a test signal from an RFID tester to the electrical contacts of at least one strap of the column of straps on the continuous web material, the column being oriented parallel to a transport direction of the continuous web material and having at least 35 straps;
   detecting for a return signal from the at least one strap, the return signal having less power than the test signal; and
   if the detecting for the return signal indicates the at least one strap is defective, then marking with a mark on an electrical contact of the at least one strap, wherein a frequency of the test signal is between 902 MHz and 928 MHz.

2. The method of claim 1 wherein the RFID tester is capacitively coupled to the electrical contacts of the at least one strap.

3. The method of claim 1 wherein the RFID tester directly contacts the at least one strap during the transmitting.

4. The method of claim 1 wherein the electrical contact is configured for attachment to an antenna.

5. The method of claim 4 wherein the electrical contact is screen printed and comprises silver.

6. The method of claim 4 wherein the electrical contact comprises copper.

7. The method of claim 1 wherein the at least one strap further comprises:
   a tape layer between the electrical contact and an RFID chip; and
   a conductive material through at least one hole in the tape layer to electrically connect the electrical contact and the RFID chip.

8. The method of claim 1 wherein the mark is formed by a laser.

9. A method for testing a column of radio frequency identification (RFID) straps,
   wherein an RFID strap in the column of RFID straps comprises:
   an RFID chip on a web material; and
   a pair of electrical contacts on the web material coupled to the RFID chip,
   the method comprising:
   transmitting by a transmitting means a test signal from an RFID tester to at least one strap of the column of straps on the web material, the column being oriented parallel to a transport direction of the web material and having at least 35 straps;
   detecting by a detecting means a return signal from the at least one strap, the return signal having less power than the test signal; and
   if the detecting for the return signal indicates the at least one strap is defective, then marking with a mark on an electrical contact of the at least one strap by a marking means.

10. The method of claim 9 wherein the RFID tester is capacitively coupled to the electrical contacts of the at least one strap.

11. The method of claim 9 wherein the RFID tester directly contacts the at least one strap during the transmitting.

12. The method of claim 9 wherein the electrical contact is configured for attachment to an antenna.

13. The method of claim 12 wherein the electrical contact is screen printed and comprises silver.

14. A method for testing radio frequency identification (RFID) straps,
wherein an RFID strap comprises:
an RFID chip on a web material; and
a pair of electrical contacts on the web material coupled to the RFID chip,
the method comprising:
transmitting a test signal from an RFID tester to at least one strap of the column of straps on the web material, the column being oriented parallel to a transport direction of the web material and having at least 35 straps;
detecting for a return signal from the at least one strap, the return signal having less power than the test signal; and
if the detecting for the return signal indicates the at least one strap is defective, then electronically storing the location of the at least one strap,
wherein a frequency of the test signal is between 902 MHz and 928 MHz.

15. The method of claim 14 wherein the electronically storing writes the location into a database.

16. The method of claim 14 wherein the electronically storing writes the location into non-volatile memory.

17. The method of claim 14 wherein the RFID tester is capacitively coupled to the at least one strap.

18. The method of claim 14 wherein the RFID tester directly contacts the at least one strap during the transmitting.

19. The method of claim 14 wherein the electrical contact is configured for attachment to an antenna.

20. The method of claim 19 wherein the electrical contact is screen printed and comprises silver.

21. An apparatus configured to test for defective RFID devices in a column of RFID devices on a continuous web material, each of the RFID devices including one integrated circuit attached to a substrate, the apparatus comprising:
a transmitter configured to transmit a test signal to at least one of the RFID devices in the column of RFID devices, the column being oriented parallel to a transport direction of the continuous web material and having at least 35 RFID devices in the column and wherein a frequency of the test signal is between 902 MHz and 928 MHz;
a receiver configured to receive a return signal from the at least one of the RFID devices, the return signal having less power than the test signal;
a processor, coupled to the receiver, the processor being configured to determine if the at least one of the RFID devices is defective; and
a marking device, coupled to the processor, the marking device being configured to place a mark on an electrical contact of each of the plurality of RFID devices that is determined to be defective.

22. The apparatus as in claim 21 wherein each of the RFID devices comprises an RFID strap and wherein the substrate is disposed in a roll.

23. The apparatus as in claim 22 wherein the substrate is a flexible plastic substrate.

24. The apparatus as in claim 23 wherein the electrical contact is configured for attachment to an antenna.

25. The apparatus as in claim 24 wherein the electrical contact is larger in area than a contact on the integrated circuit.

* * * * *